(12) United States Patent
Russ et al.

(10) Patent No.: US 9,197,061 B2
(45) Date of Patent: Nov. 24, 2015

(54) ELECTROSTATIC DISCHARGE CLAMPING DEVICES WITH TRACING CIRCUITRY

(75) Inventors: Christian Russ, Diedorf (DE); Wolfgang Soldner, Unterhaching (DE); Klaus von Arnim, Munich (DE); David Alvarez, Munich (DE); Krzysztof Domanski, Munich (DE); Gernot Langguth, Oberhaching (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 1090 days.

(21) Appl. No.: 12/975,210

(22) Filed: Dec. 21, 2010

(65) Prior Publication Data

US 2012/0154962 A1 Jun. 21, 2012

(51) Int. Cl.
*H02H 9/00* (2006.01)
*H02H 9/04* (2006.01)
*H01L 27/02* (2006.01)

(52) U.S. Cl.
CPC ............ *H02H 9/046* (2013.01); *H01L 27/0285* (2013.01)

(58) Field of Classification Search
USPC ........................................................ 361/56
See application file for complete search history.

(56) References Cited

U.S. PATENT DOCUMENTS

| | | | |
|---|---|---|---|
| 5,610,791 A | 3/1997 | Voldman | |
| 6,002,568 A | 12/1999 | Ker et al. | |
| 6,011,681 A | 1/2000 | Ker et al. | |
| 6,078,487 A * | 6/2000 | Partovi et al. | 361/56 |
| 6,947,267 B2 | 9/2005 | Liu et al. | |
| 7,233,467 B2 | 6/2007 | Mergens et al. | |
| 7,817,386 B2 * | 10/2010 | Ker et al. | 361/56 |
| 7,848,068 B2 | 12/2010 | Chen et al. | |
| 2004/0160717 A1 * | 8/2004 | May et al. | 361/91.5 |
| 2004/0232492 A1 * | 11/2004 | Ker et al. | 257/355 |
| 2007/0205800 A1 * | 9/2007 | Ker et al. | 326/21 |
| 2009/0057768 A1 | 3/2009 | Chen | |
| 2009/0168280 A1 | 7/2009 | Huang et al. | |
| 2010/0073833 A1 | 3/2010 | Hong et al. | |
| 2011/0063763 A1 | 3/2011 | Alvarez et al. | |

OTHER PUBLICATIONS

Non-Final Office Action for U.S. Appl. No. 12/975,069, mailed on Sep. 14, 2012, Christian Russ et al., "Electrostatic Discharge Blocking Circuits," 18 pages.

* cited by examiner

*Primary Examiner* — Ronald W Leja
(74) *Attorney, Agent, or Firm* — SpryIP, LLC

(57) ABSTRACT

Techniques and architectures corresponding to electrostatic discharge clamping circuits with tracing circuitry are described.

17 Claims, 7 Drawing Sheets

ELECTROSTATIC DISCHARGE CLAMPING DEVICES WITH TRACING CIRCUITRY

BACKGROUND

Electrostatic discharge events that occur on a semiconductor chip may cause voltage increases that damage components of functional circuit blocks on the semiconductor chip. In some cases, the components may become nonfunctional when subject to a voltage spike that occurs during an electrostatic discharge event.

In a particular situation, metal oxide semiconductor (MOS) transistors may be included in interface circuits that are located between functional circuit blocks of a semiconductor chip. For example, the interface circuits may include buffer circuits that amplify the signal for a functional circuit block receiving a signal from another functional circuit block. In some cases, the different functional circuit blocks may be supplied by different power domains. That is, the positive and negative supply voltages provided to one functional circuit block may be provided by different sources than the positive and negative supply voltages provided to another functional circuit block. In some cases, the buffer circuits include MOS transistors with ultra thin gate dielectrics that may be particularly sensitive to damage during an electrostatic discharge event due to the voltage differences that can occur between the different power domains of the semiconductor chip. In some instances, clamping circuits may be coupled to the buffer circuits in order to prevent the voltage at the gates of the buffer circuit transistors from exceeding a specified value during an electrostatic discharge event.

The functional circuit blocks of an integrated circuit may also be coupled to supply voltages by a switch. The switches may be MOS transistors that temporarily switch off either the positive supply voltage or the negative supply voltage in order to decrease power consumption of the block when not in use. In some scenarios, the clamping circuits coupled to the buffer circuits to mitigate the effects of electrostatic discharge events may be incompatible with these micro switches. To illustrate, when the micro switch is turned off and a functional block of the semiconductor chip is not powered, leakage current in the functional circuit block coupled to the interface circuit may cause either the voltage at the internal positive or negative supply line to drift toward the opposite potential (i.e. the voltage of the internal positive supply line may drift toward the voltage of the negative supply voltage or the voltage of the internal negative supply line may float toward the voltage of the positive supply voltage). The drifting of the supply line voltages may activate transistors of a clamping circuit included in the interface circuit and cause additional current to flow to other parts of the semiconductor chip, which leads to an increase in power consumption. In some instances, the cross-domain current may occur between differing power domains and cause malfunction of a buffer circuit included in the interface circuit.

BRIEF DESCRIPTION OF THE DRAWINGS

The detailed description is described with reference to the accompanying figures. In the figures, the left-most digit(s) of a reference number identifies the figure in which the reference number first appears. The use of the same reference number in different instances in the description and the figures may indicate similar or identical items.

DETAILED DESCRIPTION

Figure 1:
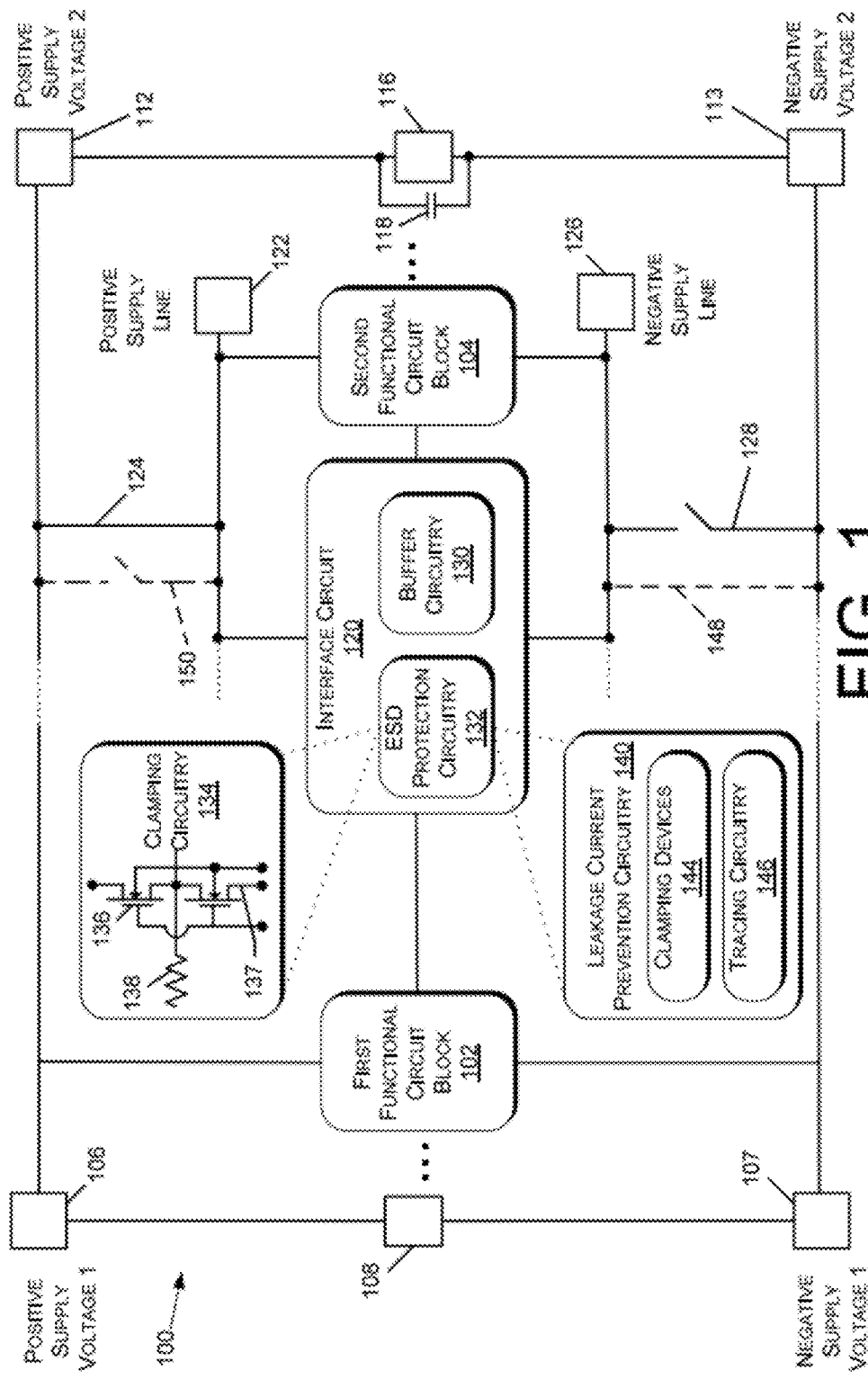
FIG. 1 is a schematic diagram of a system including an interface circuit coupled between functional circuit blocks of a semiconductor chip, where the interface circuit includes an electrostatic discharge protection circuit.

This disclosure describes an interface circuit that includes an electrostatic discharge (ESD) protection circuit. The interface circuit includes a circuit arrangement that comprises a p-channel metal oxide semiconductor (PMOS) buffer transistor configured to receive an input signal from a first functional circuit block at a gate of the PMOS buffer transistor. The PMOS buffer transistor may also be configured to provide a first portion of an output signal to a second functional circuit block. The circuit arrangement also includes an n-channel metal oxide semiconductor (NMOS) buffer transistor configured to receive the input signal from the first functional circuit block at a gate of the NMOS buffer transistor and configured to provide a second portion of the output signal to the second functional circuit block. A drain of the NMOS buffer transistor is coupled to a drain of the PMOS buffer transistor.

In addition, the circuit arrangement includes a PMOS clamping transistor. A drain of the PMOS clamping transistor is coupled to a gate of the PMOS buffer transistor. The circuit arrangement also includes an NMOS clamping transistor. A drain of the NMOS clamping transistor is coupled to a gate of the NMOS buffer transistor.

Further, a gate and a body terminal of the PMOS clamping transistor are coupled to at least one PMOS tracing transistor. In some situations, the at least one PMOS tracing transistor is configured to provide voltages at a gate of the PMOS clamping transistor and at a body terminal of the PMOS clamping transistor that are (close to, but) below a threshold voltage of the PMOS clamping transistor. As used in this disclosure in relation to threshold voltages, the terms "above" and/or "below" are used to describe a value of a voltage with respect to the absolute value of a particular threshold voltage. It is noted that the threshold voltages of PMOS transistors are typically defined with a negative sign, but the terms below or above are meant with reference to the absolute values (ABS). Additionally, a gate and a body terminal of the NMOS clamping transistor are coupled to at least one NMOS tracing transistor. In some cases, the at least one NMOS tracing transistor is configured to provide voltages at a gate of the NMOS clamping transistor and at a body terminal of the NMOS clamping transistor that are (close to, but) below a threshold voltage of the NMOS clamping transistor. During an ESD event, the NMOS clamping transistor and/or the PMOS clamping transistor are operable to shunt the ESD current and by forming a voltage divider with the impedance element to limit the ESD voltage at a gate of the NMOS buffer transistor and/or a gate of the PMOS buffer transistor.

The circuit arrangement may also be compatible with micro switches that may be utilized to couple the interface circuit to an external negative supply voltage or an external positive supply voltage. In particular, the circuit arrangement operates to reduce leakage current through the functional circuit block by utilizing the at least one NMOS tracing transistor and/or the at least one PMOS tracing transistor to block any leakage current from travelling to other portions of the circuit arrangement. Thus, power consumption by the circuit arrangement is minimized.

FIG. 1 is a schematic diagram of a system 100 including an interface circuit coupled between functional circuit blocks of a semiconductor chip, where the interface circuit includes an electrostatic discharge protection circuit. The system 100 includes a first functional circuit block 102 and a second functional circuit block 104. The functional circuit blocks 102, 104 may include logic to perform operations of a semiconductor chip included in a particular computing device, such as a personal semiconductor, a laptop semiconductor, a netbook semiconductor, a personal digital assistant (PDA), a portable gaming device, a wireless communication device (e.g., a smart phone, a mobile handset, etc.), a set-top box, a game console, a portable music player, a router, a household appliance, a personal item (e.g., a wristwatch, calculator, etc.), other network connected devices, and so forth. In the illustrative embodiment shown in FIG. 1, the first functional circuit block 102 may serve as a signal transmitter or driver for the second functional circuit block 104, which serves as a signal receiver.

The first functional circuit block 102 may be coupled to a first positive supply voltage via a connector 106, such as a pad, a pin, and the like. The first functional circuit block 102 may also be coupled to a first negative supply voltage, such as ground, via a connector 107. The first positive supply voltage and the first negative supply voltage may provide potential to components of the first functional circuit block 102. For example, the first positive supply voltage may be utilized to drive PMOS transistors of the first functional circuit block 102, while the negative supply voltage may be utilized to drive NMOS transistors of the first functional circuit block 102. The first positive supply voltage and the first negative supply voltage may be provided by external off-chip sources. In some cases, clamping circuitry 108 may be coupled between the connector 106 and the connector 107 to provide ESD protection between the first positive supply voltage and the first negative supply voltage. The clamping circuitry 108 may include one or more MOS transistors, one or more bipolar transistors, one more silicon controlled rectifiers (SCRs), one or more diodes, one or more capacitors, or a combination thereof.

Additionally, the second functional circuit block 104 may be coupled to a second positive supply voltage via a connector 112 and to a second negative supply voltage, such as ground, via a connector 113. The second positive supply voltage and the second negative supply voltage may provide potential to components of the second functional circuit block 104. Clamping circuitry 116 may be coupled between the connectors 112 and 113 to provide ESD protection between the second positive supply voltage and the second negative supply voltage. Additionally, capacitive circuitry represented by the capacitor 118 in FIG. 1, may be coupled to the input and output nodes of the clamping circuitry 116.

The system 100 also includes an interface circuit 120 coupled between the first functional circuit block 102 and the second functional circuit block 104. The interface circuit 120 is coupled to a positive supply line via a connector 122. The positive supply line may serve as a local positive supply voltage to the interface circuit 120. In some instances, the source of the positive supply line may be the second positive supply voltage. The interface circuit 120 may also be coupled to the positive supply voltage via a connector 124, which is coupled to the connector 112. In some embodiments, the second positive supply voltage may have a value that is the same or similar to the second positive supply voltage.

Additionally, the interface circuit 120 is coupled to a negative supply line via a connector 126. The negative supply line may serve as a local negative supply voltage to the interface circuit 120. The interface circuit 120 may also be coupled to the negative supply voltage via a connector 148, which is coupled to the connector 113. In some cases, the source of the negative supply line may be the second negative supply voltage.

In some cases, the first positive supply voltage and the positive supply line and/or the first negative supply voltage and the negative supply line may be in the same power domain. That is, the first positive supply voltage and the positive supply line and/or the first negative supply voltage and the negative supply line may have approximately the same or similar value and are distributed on the chip by the same conductive network. For example, the first negative supply voltage and the negative supply line may be coupled to ground. In other cases, the first positive supply voltage and the positive supply line and the first negative supply voltage and negative supply line may be associated with different power domains. To illustrate, the first positive supply voltage and the voltage at the positive supply line may be provided by different conductive networks to the components of the first functional circuit block 102 and the second functional circuit block 104, respectively and/or the first positive supply voltage and the voltage at the positive supply line may have differing voltage values.

The interface circuit 120 is also coupled to the connector 113 via a switch 128. Although the switch 128 is shown in FIG. 1 as a generic switch, the switch 128 may include any form of a switch, including one or more MOS transistors. The switch 128 may be closed to provide the second negative supply voltage to the interface circuit 120 and turn on the second functional circuit block 104. Additionally, the switch 128 may be opened in order to turn off the second functional circuit block 104 and save power with respect to a computing device that includes the system 100.

The interface circuit 120 may include buffer circuitry 130 and ESD protection circuitry 132. The buffer circuitry 130 may include components, such as MOS transistors, that buffer and amplify the signals from the first functional circuit block 102. The ESD protection circuitry 132 provides protection to the components of the buffer circuitry 130 in the event of an ESD stress in the system 100, such as a positive ESD stress or a negative ESD stress. In particular, the ESD protection circuitry 132 may reduce the impact of an ESD stress on the components of the buffer circuitry 130 by reducing the voltage experienced at the gates of MOS transistors of the buffer circuitry 130 during the ESD stress. Additionally, the ESD protection circuitry 132 may operate to provide protection during ESD events in the absence of the switch 128.

In some scenarios, the ESD protection circuitry 132 may include clamping circuitry 134. In an illustrative embodiment, the clamping circuitry 134 may include a first NMOS clamping transistor 136 and a second NMOS clamping transistor 137. A source of the first NMOS clamping transistor 136 is coupled to a drain of the second NMOS clamping transistor 137, while a drain of the first NMOS clamping transistor 136 is coupled to a positive supply voltage via the positive supply line. Additionally, a source of the second NMOS clamping transistor 137 is coupled to a negative supply voltage, via the negative supply line. The gates of the first and second NMOS clamping transistors 136, 137 may be coupled to each other and to a negative supply voltage via the negative supply line. Further, the body terminals of the first and second NMOS clamping transistors 136, 137 may be coupled to each other and to a negative supply voltage via the negative supply line. The source of the first NMOS clamping transistor 136 and the drain of the second NMOS clamping transistor 137 may be coupled to an input signal line carrying a signal from the first functional circuit block 102 to the second functional circuit block 104. The input signal line may also include an impedance device 138, such as one or more resistors, one or more MOS transistors, and so on. The first and second NMOS clamping transistors 136, 137 and the impedance device 138 may be configured to reduce the voltages at components of the buffer circuitry 130 during an ESD event in order to prevent damage to the buffer circuitry 130.

In some embodiments, where the ESD protection circuitry 132 includes the clamping circuitry 134 and when the switch 128 is opened to turn off the second functional circuit block 104, a leakage current may flow through the second functional circuit block 104. This leakage current may cause the voltage of the negative supply line to float towards the voltage of the positive supply line. Consequently, the first NMOS clamping transistor 136 and the second NMOS clamping transistor 137 may be activated and undesired cross-domain current may flow through the input signal line to the first negative supply voltage. Thus, undesired current may flow across power domains from the positive supply line and the negative supply line to the first negative supply voltage. This leakage current may result in increased power consumption for the system 100 and/or damage to components of the system 100.

In order to reduce or eliminate the current flowing through the clamping circuitry 134, the ESD protection circuitry 132 may include leakage current prevention circuitry 140 that is used in place of the clamping circuitry 134. The leakage current prevention circuitry 140 may include one or more clamping devices 144. In some cases, the clamping devices 144 may include one or more MOS transistors. For example, the clamping devices 144 may include a PMOS clamping transistor coupled to a PMOS transistor of the buffer circuitry 130 and an NMOS clamping transistor coupled to an NMOS transistor of the buffer circuitry 130. In a particular embodiment, during an ESD stress event, the clamping devices 144 are configured to shunt the ESD energy away from the gates of the MOS transistors of the buffer circuitry 130 in order to reduce or prevent damage to the MOS transistors of the buffer circuitry 130. Furthermore, the leakage current prevention circuitry 140 may also be configured to provide ESD protection for an external interface circuit, such as a buffer circuit that receives a signal from outside the semiconductor chip.

The leakage current prevention circuitry 140 also includes tracing circuitry 146. The tracing circuitry 146 may include one or more MOS transistors coupled to the clamping devices 144. For example, the tracing circuitry 146 may include at least one PMOS tracing transistor coupled to a PMOS clamping device and at least one NMOS tracing transistor coupled to an NMOS clamping device. The tracing circuitry 146 may be configured to control a gate voltage and a body terminal voltage of the clamping devices 144 below a threshold voltage during normal operation of the circuit arrangement 100. In this way, the integrity and/or speed of the input signal to the second functional circuit block 104 are maintained. Further, the tracing circuitry 146 may be configured to control a gate voltage of the clamping devices 144 to block leakage current from the second functional circuit block 104 when the switch 128 is opened. Consequently, power consumption of the system 100 may be reduced when the ESD protection circuitry 132 includes the leakage current prevention circuitry 140.

In alternative embodiments, the switch 128 may be replaced with a connector 148 and the connector 124 may be replaced with a switch 150. The connector 148 may be utilized to couple the interface circuit 120 to the second negative supply voltage, while the switch 150 may be utilized to couple the interface circuit 120 to the second positive supply voltage. When the system 100 includes the switch 150, the interface circuit 120 operates in manner complementary to the manner described above in embodiments where the system 100 includes the connector 124 and the switch 128. In particular, the clamping devices 144 of the leakage current prevention circuitry 140 may be configured to reduce the voltage provided to the gates of MOS transistors of the buffer circuitry 130, particularly PMOS transistors, during an ESD event and thereby protect the MOS transistors of the buffer circuitry 130 from damage during the ESD event. Additionally, the ESD protection circuitry 132 may operate to provide protection during ESD events in the absence of the switch 150.

Figure 2:
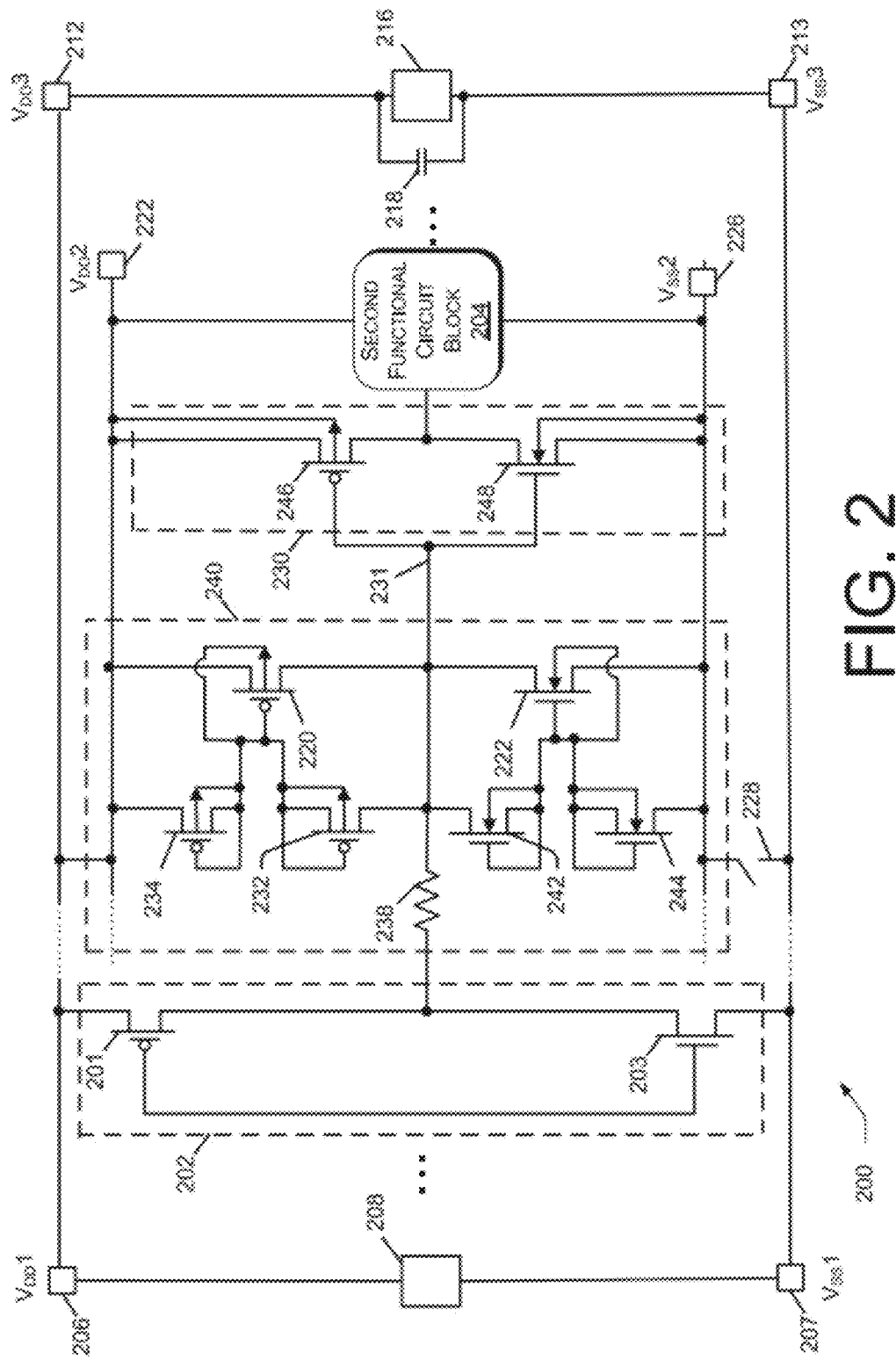
FIG. 2 is a schematic diagram of an architecture including leakage current prevention circuitry coupled to a buffer circuit that is coupled between functional circuit blocks of a semiconductor chip. The leakage current prevention circuitry is coupled to an external negative supply voltage via a micro switch.

FIG. 2 is a schematic diagram of an architecture 200 including leakage current prevention circuitry 240 coupled to a buffer circuit 230 that is coupled between functional circuit blocks 202, 204 of a semiconductor chip. The leakage current prevention circuitry 240 is coupled to an external negative supply voltage via a micro switch 228. The architecture 200 includes a first functional circuit block 202. The first functional circuit block 202 may include a number of transistors represented by PMOS transistor 201 and NMOS transistor 203. The first functional circuit block 202 may also include a number of other components, such as one or more impedance devices, one or more capacitors, one or more inductors, one or more switches, one or more diodes, and the like. The components of the first functional circuit block 202 may be arranged in order to perform certain operations for a computing device.

The first functional circuit block 202 may be coupled to a pad, pin, wire, or other suitable connector, 206 that provides a positive supply voltage, $V_{DD}1$ to the first functional circuit block 202. $V_{DD}1$ may also be provided to other portions of a semiconductor chip that includes the architecture 200. The first functional circuit block 202 may also be coupled to connector 207 that provides a negative supply voltage, $V_{SS}1$ to the first functional circuit block 202. Additionally, a clamping circuit 208 may be coupled between the connectors 206, 207. The clamping circuit 208 can provide protection for $V_{DD}1$ and $V_{SS}1$ during electrostatic discharge events. For example, the clamping circuit 208 may limit any overvoltage that occurs between $V_{DD}1$ and $V_{SS}1$ during an electrostatic discharge event.

The architecture 200 also includes leakage current prevention circuitry 240 coupled to buffer circuitry 230. The leakage current prevention circuitry 240 may be referred to as a secondary clamping stage, which protects external interface circuits, such as buffer circuitry 230 that receives a signal from outside the semiconductor chip. The leakage current prevention circuitry 240 and the buffer circuitry 230 may form an interface circuit, such as the interface circuit 120 of FIG. 1. The leakage current prevention circuitry 240 receives a signal from the first functional circuit block 202 and provides the signal to the buffer circuitry 230 as an input signal. The input signal to the buffer circuitry 230 may be an analog signal or a digital signal. The buffer circuitry 230 may be configured to provide proper buffering and amplification of the signal for a second functional circuit block 204

The leakage current prevention circuitry 240 includes a PMOS clamping circuit 220, an NMOS clamping circuit 222, and an impedance device 238, such as one or more resistors, one or more MOS transistors, one or more capacitors for capacitive coupling of the signal, and the like. A source of the PMOS clamping transistor 220 is coupled to a positive supply line, labeled as $V_{DD}2$, via a connector 222 and to an additional positive supply line, $V_{DD}3$, via a connector 212.

A drain of the PMOS clamping transistor 220 is coupled to an input signal line 231 that carries the signal from the first functional circuit block 202 to the buffer circuitry 230. Further, a gate and a body terminal of the PMOS clamping transistor 220 are coupled to at least one PMOS tracing transistor. In particular, the gate and the body terminal of the PMOS clamping transistor 220 are coupled to a gate, a drain, and a body terminal of a first PMOS tracing transistor 232. A source of the first PMOS tracing transistor 232 is coupled to the input signal line 231. Further, the gate and the body terminal of the PMOS clamping transistor 220 are coupled to a gate, a drain and a body terminal of a second PMOS tracing transistor 234. A source of the second PMOS tracing transistor 234 is coupled to the positive supply line, $V_{DD}2$, and the additional positive supply voltage $V_{DD}3$.

The first PMOS tracing transistor 232 and the second PMOS tracing transistor 234 may be coupled to the PMOS clamping transistor 220 in an anti-serial MOS diode configuration. That is, the gate and drain nodes of the PMOS tracing transistors 232, 234 may form one terminal of the MOS diodes, while the sources of the PMOS tracing transistors 232, 234 form the respective other terminals. Optionally, the bulk nodes of the PMOS tracing transistors 232, 234 may be additionally connected to the gate and drain nodes. Additionally, each of the MOS diodes comprised of the PMOS tracing transistors 232, 234 have the gate and drain nodes tied to a central node that is coupled to the gate of the PMOS clamping transistor 220.

The first PMOS tracing transistor 232 and the second PMOS tracing transistor 234 may be self-adjusted for threshold voltage to provide gate bias for the PMOS clamping transistor 220. In addition, diodes and MOS-diodes enter into a blocking mode when the micro switch 228 is activated and the negative supply line $V_{SS}2$ drifts towards a higher potential. The term self-adjusted is to be understood that the PMOS clamping transistor 220 and both PMOS tracing transistors 232 and 234 are having matched threshold voltages (owing to their close placement in layout and preferably same device orientation). That is, the gate bias for the clamping transistor 220 is determined by one of the PMOS transistors of the tracing circuit. Altogether, a gate voltage is reached which is close to, but less than a threshold voltage so that the PMOS clamping transistor 220 is in the sub-threshold regime.

Furthermore, although, the PMOS tracing transistors 232, 234 of FIG. 2 are shown coupled to the gate and the bulk node of the PMOS clamping transistor 220, in some cases, merely the gate of the PMOS clamping transistor 220 may be coupled to the PMOS tracing transistors 232, 234.

In addition, a source of the NMOS clamping transistor 222 is coupled to a negative supply line, labeled as $V_{SS}2$, via a connector 226 and to a switch 228. Although depicted as a generic switch in FIG. 2, the switch 228 may include one or more MOS transistors or any other devices suitable to implement a switch. The switch 228 may be operable to couple the source of the NMOS clamping transistor 222 to an additional negative supply voltage, $V_{SS}3$, via a connector 213.

A gate and a body terminal of the NMOS clamping transistor 222 are coupled to at least one NMOS tracing transistor. In particular, the gate and the body terminal of the NMOS clamping transistor 222 are coupled to a gate, a drain, and a body terminal of a first NMOS tracing transistor 242. A source of the first NMOS tracing transistor 242 is coupled to the input signal line 231. Further, the gate and the body terminal of the NMOS clamping transistor 222 are coupled to a gate, a body terminal, and a drain of the second NMOS tracing transistor 244. A source of the second NMOS tracing transistor 244 is coupled to the negative supply line, $V_{SS}2$, and the switch 228. The switch 228 may be operable to couple the source of the second NMOS tracing circuit 244 to the additional negative supply voltage, $V_{SS}3$.

The first NMOS tracing transistor 242 and the second NMOS tracing transistor 244 may be coupled to the NMOS clamping transistor 222 in an anti-serial MOS diode configuration. That is, the gate and drain nodes of the NMOS tracing transistor 242, 244 may form one terminal of the MOS diodes, while the source of the NMOS tracing transistor 242, 244 form the other terminal. Optionally, the bulk nodes of the NMOS tracing transistors 242, 244 may be additionally connected to the gate and drain nodes. Additionally, each of the MOS diodes comprised of the NMOS tracing transistors 242, 244 have the gate and drain nodes tied to a central node that is coupled to the gate of the NMOS clamping transistor 222.

Furthermore, although, the NMOS tracing transistors 242, 244 of FIG. 2 are shown coupled to the gate and the bulk node of the NMOS clamping transistor 222, in some cases, merely the gate of the NMOS clamping transistor 222 may be coupled to the NMOS tracing circuits 242, 244.

The buffer circuitry 230 includes a PMOS buffer transistor 246 and an NMOS buffer transistor 248. The gates of the PMOS buffer transistor 246 and the NMOS buffer transistor 248 are configured to receive the input signal from the first functional block 202 via the input signal line 231. Additionally, the PMOS buffer transistor 246 and the NMOS buffer transistor 248 are configured to provide an output signal to the second functional circuit block 204 via a drain of the PMOS buffer transistor 246 and a drain of the NMOS buffer transistor 248. A source and a body terminal of the PMOS buffer transistor 246 are coupled to the positive supply line $V_{DD}2$ and a reference potential, such as additional positive supply voltage $V_{DD}3$. Further, a source and a body terminal of the NMOS buffer transistor 248 are coupled to the negative supply line, $V_{SS}2$, and the switch 228.

The connector 212 is coupled to the connector 213 and a second clamping circuit 216 may be coupled between the connectors 212, 213. The second clamping circuit 216 may provide ESD protection between the additional positive supply voltage $V_{DD}3$ and the additional negative supply voltage $V_{SS}3$. The input and the output nodes of the clamping circuit 216 may be coupled to a capacitor 218. In some situations, merely the capacitor 218 is coupled between the additional positive supply voltage $V_{DD}3$ and the additional negative supply voltage $V_{SS}3$.

In some embodiments, the positive supply voltage $V_{DD}1$, the positive supply line $V_{DD}2$, and/or the additional positive supply voltage $V_{DD}3$ may be coupled to different power domains. That is the positive supply voltage $V_{DD}1$, the positive supply line $V_{DD}2$, and/or the additional positive supply voltage $V_{DD}3$ may be coupled to sources that provide different voltages, such as 1.2V, 1.8V, 2.4V, 3.3V, 5V, 12V, etc. In addition, the negative supply voltage $V_{SS}1$, the negative supply line $V_{SS}2$, and/or the additional negative supply voltage $V_{SS}3$ may be coupled to different power domains, such that the negative supply voltage $V_{SS}1$, the negative supply line $V_{SS}2$, and/or the additional negative supply voltage $V_{SS}3$ are coupled to sources that provide different voltages, such as ground, −5V, −3.3V, and so on. In some cases, the negative supply voltage $V_{SS}1$, the negative supply line $V_{SS}2$, and/or the additional negative supply voltage $V_{SS}3$ may each be coupled to ground. Furthermore, the positive supply voltages $V_{DD}1$ and $V_{DD}3$ may be referred to herein as a respective "external positive supply voltage" and the positive supply line $V_{DD}2$ may be referred herein as an "internal positive supply line." Additionally, the negative supply voltages $V_{SS}1$ and $V_{SS}3$ may be referred to herein as a respective "external negative supply voltage" and the negative supply line $V_{SS}2$ may be referred herein as an "internal negative supply line."

In a particular situation, the switch 228 is closed and the second functional circuit block 204 is turned on. While the switch 228 is closed, a voltage at a gate of the PMOS clamping circuit 220 and a voltage at a gate of the NMOS clamping transistor 222 may be floating. The first PMOS tracing transistor 232 and the second PMOS tracing transistor 234 may be configured to control a voltage at the gate of the PMOS clamping transistor 220 and a voltage of the body terminal of the PMOS clamping transistor 220 to be less than a threshold voltage of the PMOS clamping transistor 220. In some cases, the first PMOS tracing transistor 232 and the second PMOS tracing transistor 234 may control the voltages of the gate and body terminal of the PMOS clamping transistor 220 to be relatively close in value to the threshold voltage of the PMOS clamping transistor 220, such that the PMOS clamping transistor 220 is operating in a sub-threshold range. In this way, the PMOS clamping transistor 220 is off and the integrity and speed of the input signal from the first functional circuit block 202 is maintained.

Furthermore, the first NMOS tracing transistor 242 and the second NMOS tracing transistor 244 may be configured to control a voltage of the gate of the NMOS clamping transistor 222 and a voltage of the body terminal of the NMOS clamping transistor 222 to be less than a threshold voltage of the NMOS clamping circuit 222. In some cases, the first NMOS tracing transistor 242 and the second NMOS tracing transistor 244 may control the voltages of the gate and body terminal of the NMOS clamping transistor 222 to be relatively close in value to the threshold voltage of the NMOS clamping transistor 222, such that the NMOS clamping transistor 222 is operating in a sub-threshold range. In this way, the NMOS clamping transistor 222 is off and the integrity and speed of the input signal from the first functional circuit block 202 is maintained.

In another scenario, the second functional circuit block 204 is turned off and the switch 228 may be opened in order to reduce leakage current from the second functional circuit block 204. For example, the voltage of the negative supply line, $V_{SS}2$, may float between the additional negative supply voltage $V_{SS}3$ and the voltage of the positive supply line, $V_{DD}2$ and/or additional positive supply voltage $V_{DD}3$ and little or no leakage current from the second functional circuit block 204 may result due to the arrangement of components of the architecture 200. In particular, the PMOS tracing transistors 232, 234 are configured to turn off the PMOS clamping transistor 220 when the second functional circuit block 204 is turned off. Additionally, the NMOS tracing transistors 242, 244 are configured to turn off the NMOS clamping transistor 222 when the second functional circuit block 204 is turned off. In this way, any leakage current from the second functional circuit block 204 is blocked by the PMOS tracing transistors 232, 234 and the NMOS tracing transistors 242, 244 from flowing to other portions of the architecture 200 and across power domains, thereby minimizing power consumption.

Furthermore, while the switch 228 is open, an electrostatic discharge event may occur. The electrostatic discharge event may cause the switch 228 to close, to open, or to otherwise be in an undefined state. In a particular example, an electrostatic discharge event may take place, such as a cross-domain ESD stress between the negative supply line, $V_{SS}2$, and the positive supply voltage, $V_{DD}1$. In this example, the NMOS clamping transistor 222 may be configured to shunt the energy of the electrostatic discharge event to $V_{SS}2$ and/or $V_{SS}3$. Specifically, the MOS diodes formed by the NMOS tracing transistors 242, 244 may be configured to block current from the gate of the NMOS buffer transistor 248. Further, the impedance device 238 may be configured to aid in dissipating the electrostatic discharge voltage energy. Accordingly, the voltage experienced by the gate of the NMOS buffer transistor 248 during the ESD event is reduced and damage to the gate of the NMOS buffer transistor 248 is minimized or eliminated.

Although the embodiment shown in FIG. 2 indicates that the body terminal of the PMOS buffer transistor 246 is coupled to the source of the PMOS buffer transistor 246 and the body terminal of the NMOS buffer transistor 248 is coupled to the source of the NMOS buffer transistor 248, the body terminals of the PMOS and NMOS buffer transistors 246, 248 may be coupled in different arrangements. For example, the body terminal of the PMOS buffer transistor 246 may be coupled to the drain of the PMOS buffer transistor 246 and the body terminal of the NMOS buffer transistor 248 may be coupled to the drain of the NMOS buffer transistor 248. In another example, the body terminal of the PMOS buffer transistor 246 may be coupled to the second and third positive supply voltages $V_{DD}2$ and $V_{DD}3$, while the body terminal of the NMOS buffer transistor 248 may be coupled to the second negative supply voltage $V_{SS}2$. In addition, although the body terminals of the PMOS and NMOS tracing transistors 232, 234 are shown coupled to the respective drains of the PMOS and NMOS tracing transistors 232, 234, the body terminal of the PMOS tracing transistor 232 may be coupled to the source of the PMOS tracing transistor 232 and the body terminal of the NMOS tracing transistor 224 may be coupled to the source of the NMOS tracing transistor 234.

Further, in some embodiments, the p-wells of the NMOS clamping transistor 222 and the NMOS tracing transistors 242, 244 may be isolated from a p-substrate of the semiconductor chip that includes the architecture 200. Thus, the p-wells of the transistors 222, 242, 244 may be separated from the p-substrate by an n-doped region. In some instances, the transistors 220, 222, 232, 234, 242, 244 may share a common n-well. In some instances 222, 242, 244 share the same isolated p-well, and 220, 232, 234 share the same n-well.

In some embodiments, the NMOS clamping transistor 222 and the NMOS tracing transistors 242, 244 may be of a same or similar size. That is the gate width to length ratio (W/L) of the transistors 222, 242, 244 may be the same or similar. Additionally, the PMOS clamping transistor 220 and the PMOS tracing transistors 232, 234 may be of a same or similar size with the same or similar W/L ratios. In other embodiments, the NMOS clamping transistor 222 may have a larger W/L ratio than the NMOS tracing transistors 242, 244. Further, the PMOS clamping transistor 220 may have a larger W/L ratio than the PMOS tracing transistors 232, 234. The NMOS clamping transistor 222 and/or the PMOS clamping transistor 220 may have larger W/L ratios than their respective tracing transistors 242, 244 and 232, 234 in order to increase protection of the buffer transistors 246, 248 during an ESD event.

In addition, in some cases, the threshold voltages of the PMOS clamping transistor 220 may be the same or similar to the threshold voltages of the PMOS tracing transistors 232, 234, while in other cases the threshold voltage of the PMOS clamping transistor 220 is different from the threshold voltage of the PMOS tracing transistors 232, 234. Furthermore, the threshold voltage of the NMOS clamping transistor 222 may be the same or similar to the threshold voltages of the NMOS tracing transistors 242, 244. Alternatively, the threshold voltage of the NMOS clamping transistor 222 may be different from the threshold voltages of the NMOS tracing transistors 242, 244. The threshold voltages of the clamping transistors 220, 222 may differ from the threshold voltages of their respective tracing transistors 232, 234 and 242, 244 due to different doping of the n-wells or p-wells of the clamping transistors 220, 222. For example, the doping of the n-well of the PMOS clamping transistor 220 may be different from the doping of the n-wells of the PMOS tracing transistors 232, 234 by providing different doping concentrations for the n-wells of the PMOS clamping transistor 220 and the PMOS tracing transistors 232, 234. In another example, the doping of the p-wells of the NMOS clamping transistor 222 may be different from the doping of the p-wells of the NMOS tracing transistors 242, 244 by providing different doping concentrations for the p-wells of the NMOS clamping transistor 222 and the NMOS tracing transistors 242, 244. Different well types may be accomplished by different doping concentrations such as threshold voltage adjustment dopings as part of the overall well dopings.

The threshold voltages of the clamping transistors 220, 222 may also differ from the threshold voltages of their respective tracing transistors 232, 234 and 242, 244 due to the threshold voltage roll-off effect. In particular, the gate length of the PMOS clamping transistor 220 may differ from the gate length of the PMOS tracing transistors 232, 234 and/or the gate length of the NMOS clamping transistor 222 may differ from the gate length of the NMOS tracing transistors 242, 244. By configuring the threshold voltage of the PMOS clamping transistor 220 and/or the threshold voltage of the NMOS clamping transistor 222 to be higher than the threshold voltages of their respective tracing transistors 232, 234 and 242, 244, leakage current through the clamping transistors 220, 222 may be minimized. Other adjustment techniques of the gate bias voltage may exist such as usage of different transistor types (NMOS vs. PMOS, threshold voltage types, etc.) for both the tracing transistor and respective clamping transistor.

Although, FIG. 2 shows a complementary MOS arrangement with the PMOS clamping transistor 220 and the PMOS tracing transistors 232, 234 coupled to the NMOS clamping transistor 222 and the NMOS tracing transistors 242, 244, the circuit arrangement 200 may include clamping transistors and tracing transistors of one MOS type. In one example, the clamping transistors 220 and 222 may be implemented as NMOS transistors with the tracing transistors 232, 234, 242, 244 also implemented as NMOS transistors. In another example, the clamping transistors 220 and 222 may be implemented as PMOS transistors with the tracing transistors 232, 234, 242, 244 also implemented as PMOS transistors.

Furthermore, the circuit arrangement 200 may be implemented with ESD protection circuitry coupled to only one of the buffer transistors 246, 248. In particular, the circuit arrangement 200 may be implemented with the PMOS clamping transistor 220 and the PMOS tracing transistors 232, 234 coupled to the PMOS buffer transistor 246, but without the NMOS clamping transistor 222 and the NMOS tracing transistors 232, 234 and without the NMOS buffer transistor 248. Conversely, the circuit arrangement 200 may be implemented with the NMOS clamping transistor 222 and the NMOS tracing circuits 242, 244 coupled to the NMOS buffer transistor 248, but without the PMOS clamping transistor 220 and the PMOS tracing transistors 232, 234 and without the PMOS buffer transistor 246 present. Furthermore, individual leakage prevention circuits 240 may be stacked in case of applications having higher voltages than the voltage the device is natively suited for.

Figure 3:
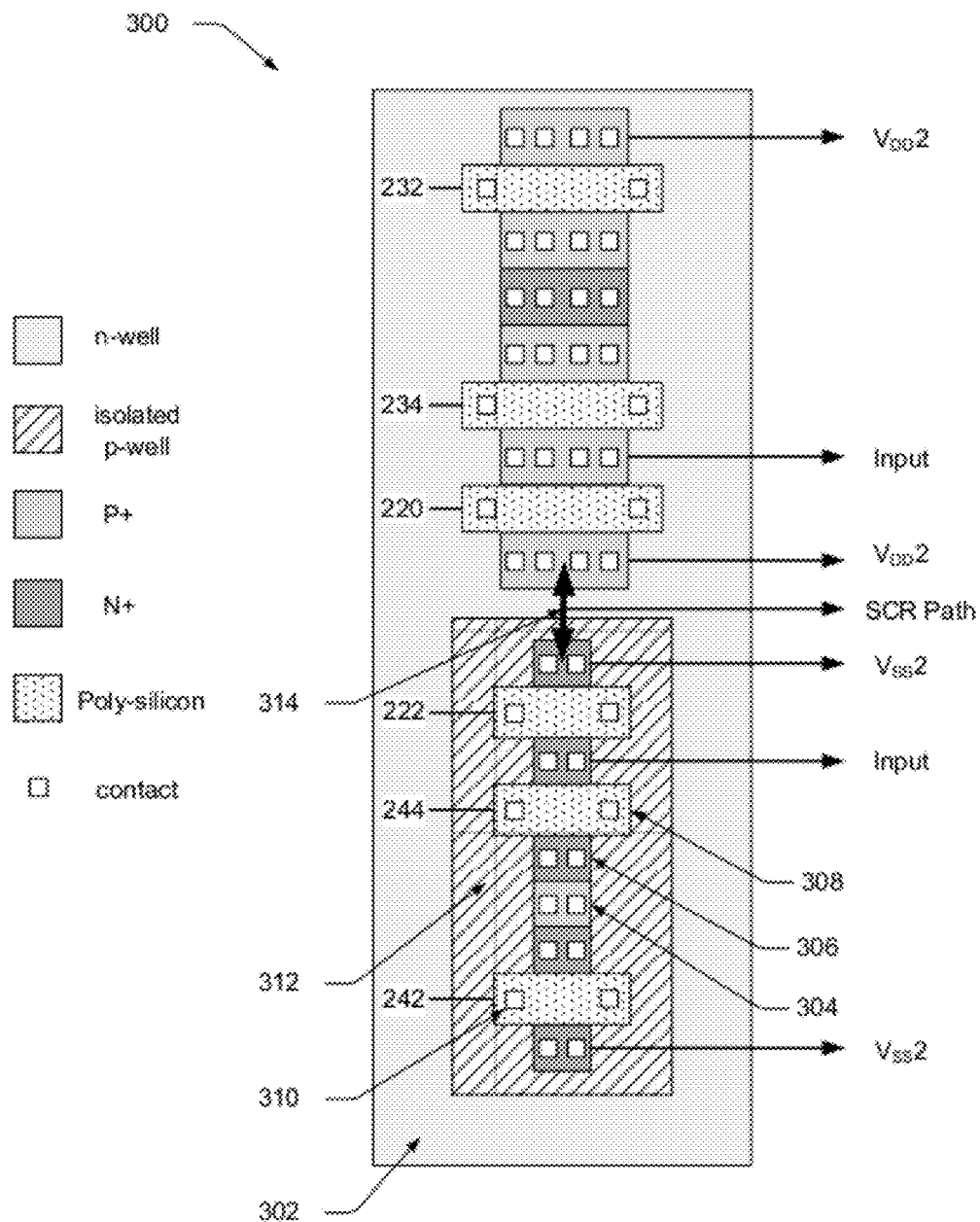
FIG. 3 is a diagram showing a first embodiment of a layout of the architecture of FIG. 2.

FIG. 3 is a diagram showing a first embodiment of a layout 300 of the architecture of FIG. 2. The layout 300 shows an n-well 302 that is common to the transistors 220, 222, 232, 234, 242, 244 of FIG. 2. Additionally, the layout 300 shows the arrangement of p-type and n-type material of the PMOS clamping transistor 220, the NMOS clamping transistor 222, the PMOS tracing circuits 232, 234, and the NMOS tracing circuits 242, 244, such as the representative p-type material 304 and the representative n-type material 306. The layout 300 also shows poly-crystalline silicon material comprising the gates of the transistors 220, 222, 232, 234, 242, 244 and shown by the representative poly-crystalline silicon material 308 and contacts of the transistors 220, 222, 232, 234, 242, 244 shown by a representative contact 310.

Further, the layout 300 shows that the NMOS transistors 222, 242, and 244 share an isolated p-well 312. In addition, the layout 300 shows the connections of the transistors 220, 222, 232, 234, 242, 244 to other components of the circuit arrangement 200. For example, the layout 300 shows connections to the input signal line, labeled as "Input" in FIG. 3, that is coupled between the functional circuit blocks 202, 204 and the connections to the positive supply line, labeled as $V_{DD}2$ in FIG. 3, and the negative supply line, labeled as $V_{SS}2$ in FIG. 3.

Due to the arrangement of the clamping transistors 220, 222 in the layout 300, a silicon controlled rectifier (SCR) path 314 may result by forming a pnpn structure (p+ source of PMOS clamping transistor 220 coupled to the internal positive supply line labeled as $V_{DD}2$, n-well 302, isolated p-well 312, n+ source of NMOS clamping transistor 222 coupled to the internal negative supply line labeled as $V_{SS}2$). For the layout 300, the SCR path 314 may provide further ESD protection. In particular, the SCR path 314 may provide additional ESD protection between external supply voltages, such as the additional negative and positive supply voltages, $V_{DD}3$ and $V_{SS}3$ of FIG. 2.

Figure 4:
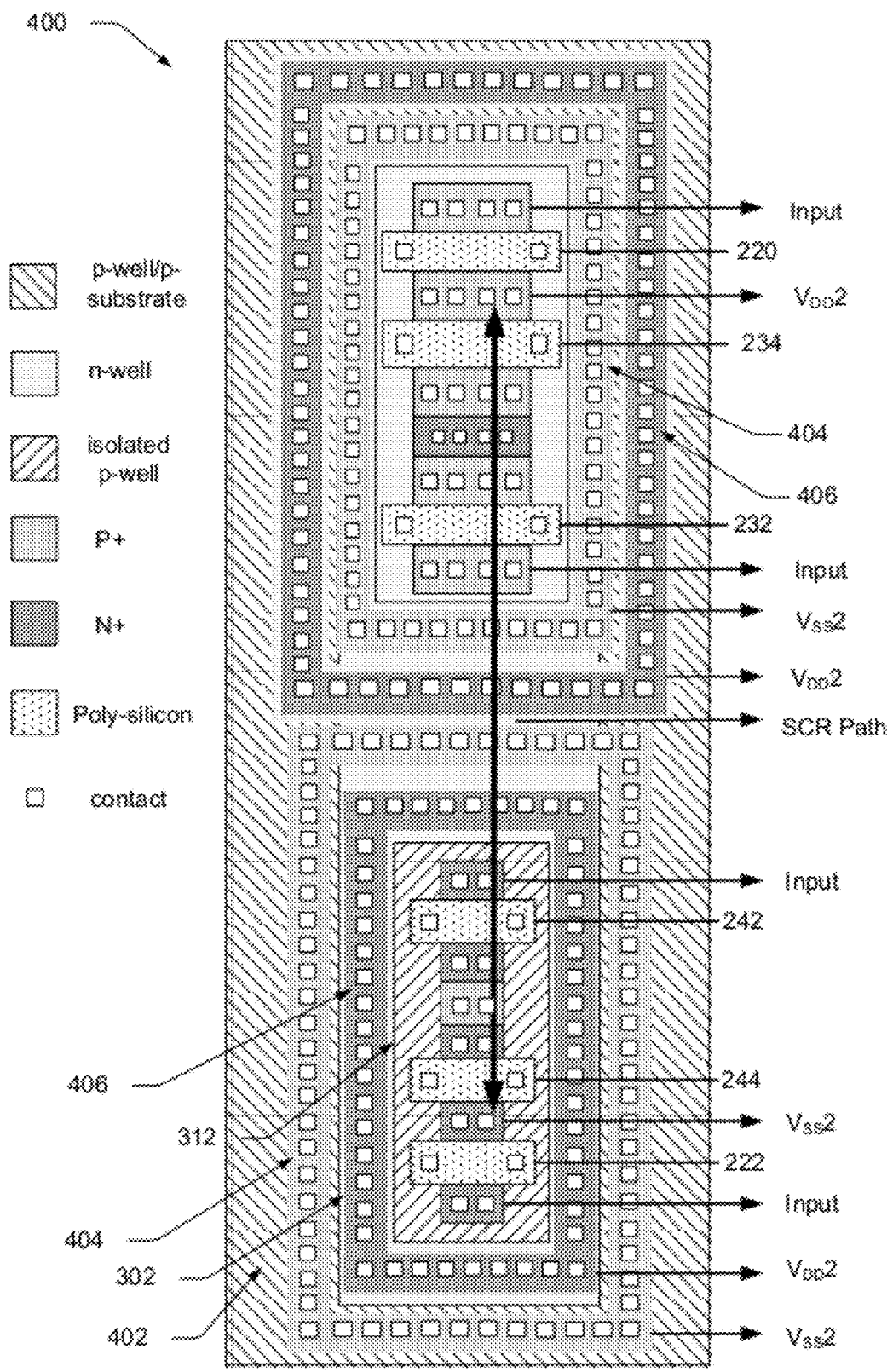
FIG. 4 is a diagram showing a second embodiment of a layout of the architecture of FIG. 3.

FIG. 4 is a diagram showing a second embodiment of a layout of the architecture of FIG. 2. The layout 400 shows a p-well/p-substrate 402 that is common to the transistors 220, 222, 232, 234, 242, 244 of FIG. 2. Additionally, the layout 400 shows the arrangement of p-type and n-type material of the PMOS clamping transistor 220, the NMOS clamping transistor 222, the PMOS tracing transistors 232, 234, and the NMOS tracing transistors 242, 244. The layout 400 also shows poly-crystalline silicon material comprising the gates of the transistors 220, 222, 232, 234, 242, 244 and contacts of the transistors 220, 222, 232, 234, 242, 244. In some cases, the layout 400 may be utilized when the transistors 220, 222, 232, 234, 242, 244 are coupled to an IO pad.

The layout 400 also shows the isolated p-well 312 of the transistors 222, 242, 244 and the common n-well 302 of the transistors 220, 232, 234. Furthermore, the layout 400 includes p-type guardrings 404 and n-type guardrings 406. The guardrings 404, 406 may be configured to protect against any latchup event that may occur with respect to the transistors 220, 232, 234 and the transistors 222, 242, 244. Furthermore, by maximizing the distance between all p+ regions coupled to the positive supply line (here the source of the PMOS clamping transistor 220) and all n+ regions coupled to the negative supply line (here the source of the NMOS clamping transistor 222), additional protection against latchup is achieved by maximizing the length of the SCR path.

Figure 5:
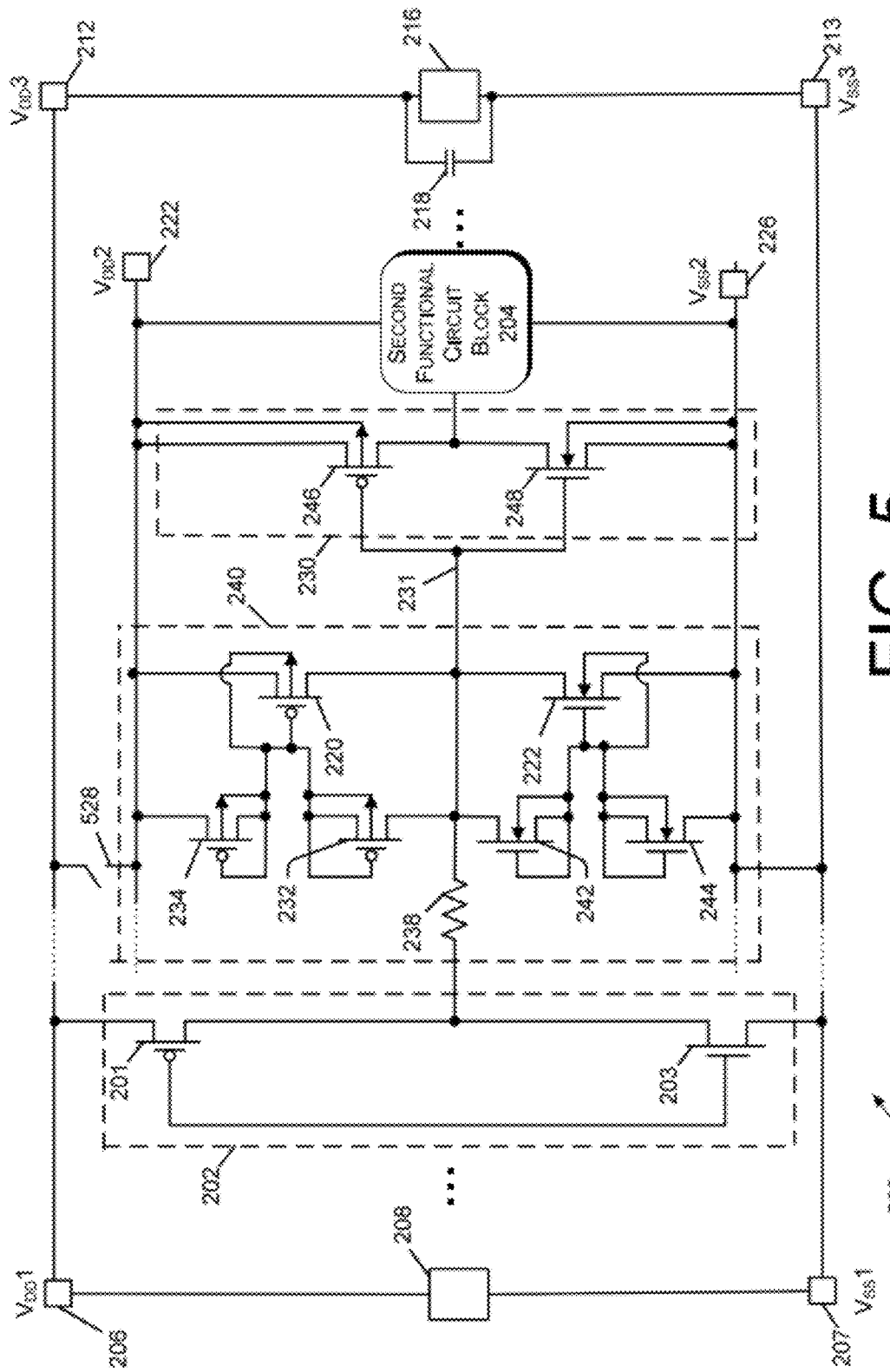
FIG. 5 is a schematic diagram of an architecture including leakage current prevention circuitry coupled to a buffer circuit that is coupled between functional circuit blocks of a semiconductor chip. The leakage current prevention circuitry is coupled to an external positive supply voltage via a micro switch.

FIG. 5 is a schematic diagram of an alternative architecture 500 including the same leakage current prevention circuitry 240 as in FIG. 2 and the same buffer circuit 230 that is coupled between functional circuit blocks 202, 204 of a semiconductor chip. In architecture 500, the leakage current prevention circuitry 240 is coupled to an external positive supply voltage via a switch 528 instead of switch 228 as illustrated in FIG. 2. The leakage current prevention circuitry 240 is coupled to an external negative supply voltage via a connector.

Figure 6:
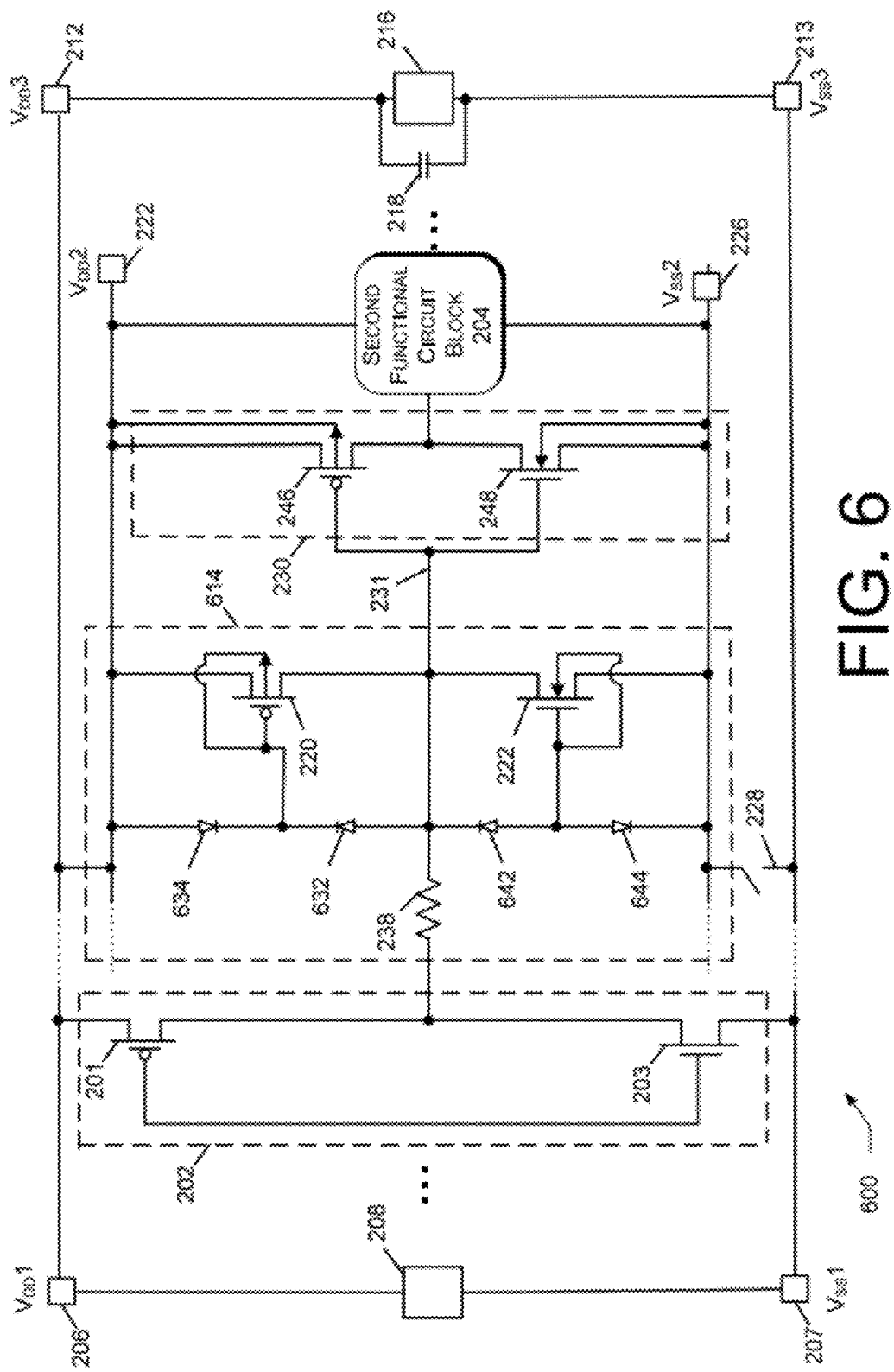
FIG. 6 is a schematic diagram of an alternative embodiment of leakage current prevention circuitry coupled to a buffer circuit that is coupled between functional blocks of a semiconductor chip.

FIG. 6 is a schematic diagram of an alternative embodiment of leakage current prevention circuitry 240 coupled to a buffer circuit 230 that is coupled between functional blocks 202, 204 of a semiconductor chip. The architecture 600 resembles the architecture 200 of FIG. 2 while the leakage current prevention circuit 614 is different from the leakage current prevention circuit 240 in FIG. 2 as described hereafter.

The architecture 600 also includes leakage current prevention circuitry 614 coupled to buffer circuitry 230. The leakage current prevention circuitry 614 and the buffer circuitry 230 may comprise an interface circuit, such as the interface circuit 120 of FIG. 1. The leakage prevention circuitry 614 receives a signal from the first functional circuit block 202 and provides the signal to the buffer circuitry 230 as an input signal. The buffer circuitry 230 may be configured to provide proper buffering and amplification of the signal for a second functional circuit block 204.

The leakage prevention circuitry 614 includes a PMOS clamping circuit 220, an NMOS clamping circuit 222, and an impedance device 238, such as one or more resistors, one or more MOS transistors, and the like. A source of the PMOS clamping transistor 220 is coupled to a positive supply line, labeled as $V_{DD}2$, via a connector 222 and to an additional positive supply voltage, $V_{DD}3$, via a connector 212. A drain of the PMOS clamping transistor 220 is coupled to an input signal line 231 that carries the signal from the first functional circuit block 202 to the buffer circuitry 230. Further, a gate and a body terminal of the PMOS clamping transistor 220 are coupled to at least one tracing diode. In particular, the gate and the body terminal of the PMOS clamping transistor 220 are coupled to a cathode of a first tracing diode 632 and a cathode of a second tracing diode 634. The first and second tracing diodes 632, 634 may be p-n junction diodes. An anode of the first tracing diode 632 is coupled to the input signal line 231, while an anode of the second tracing diode 634 is coupled to the positive supply line, $V_{DD}2$ and the positive supply voltage $V_{DD}3$.

In addition, a source of the NMOS clamping transistor 222 is coupled to a negative supply line, labeled as $V_{SS}2$, via a connector 226 and to a switch 228. The switch 228 may be operable to couple the source of the NMOS clamping transistor 220 to an additional negative supply voltage, $V_{SS}3$, via a connector 213.

A gate and a body terminal of the NMOS clamping transistor 222 are coupled to at least one tracing diode. In particular, the gate and the body terminal of the NMOS clamping transistor 222 are coupled to an anode of a third tracing diode 642 and an anode of a fourth tracing diode 644. A cathode of the third tracing diode 642 is coupled to the input signal line 231 and a cathode of the fourth tracing diode 644 is coupled to the switch 228. The switch 228 may be operable to couple the fourth tracing diode 644 to the additional negative supply voltage, $V_{SS}3$.

In a particular situation, the switch 228 is closed and the second functional circuit block 204 is turned on. While the switch 228 is closed, a voltage at a gate of the PMOS clamping circuit 220 and a voltage at a gate of the NMOS clamping transistor 222 may be floating. The first tracing diode 632 and the second tracing diode 634 may be configured to control a voltage of the gate of the PMOS clamping transistor 220 and a voltage of the body terminal of the PMOS clamping transistor 220 to be less than a threshold voltage of the PMOS clamping transistor 220. In this way, the PMOS clamping transistor 220 is off and the integrity and speed of the input signal from the first functional circuit block 202 is maintained. Furthermore, the third tracing diode 642 and the fourth tracing diode 644 may be configured to control a voltage of the gate of the NMOS clamping transistor 222 and a voltage of the body terminal of the NMOS clamping transistor 222 to be less than a threshold voltage of the NMOS clamping circuit 222. In this way, the NMOS clamping transistor 222 is off and the integrity and speed of the input signal from the first functional circuit block 202 is maintained.

In another scenario, the second functional circuit block 204 is turned off and the switch 228 may be opened in order to reduce leakage current from the second functional circuit block 204. For example, a voltage of the negative supply line, $V_{SS}2$, may float between the additional negative supply voltage $V_{SS}3$ and a voltage of the positive supply line, $V_{DD}2$ and/or the positive supply voltage $V_{DD}3$ and little or no leakage current from the second functional circuit block 204 may result due to the arrangement of components of the architecture 600. In particular, the first and second tracing diode 632, 634 are configured to turn off the PMOS clamping transistor 220 when the second functional circuit block 204 is turned off.

Additionally, the third and fourth tracing diodes 642, 644 are configured to turn off the NMOS clamping transistor 222 when the second functional circuit block 204 is turned off. In this way, any leakage current from the second functional circuit block 204 is blocked by the first and second tracing diodes 632, 634 and the third and fourth tracing diodes 642, 644 from flowing to other portions of the architecture 600 and across power domains, thereby minimizing power consumption. For example, the first tracing diode 632 allows current to flow only from the input signal line 231 to the PMOS clamping transistor 220, while the second tracing diode 634 allows current flow only from the positive supply line $V_{DD}2$ and the positive supply voltage $V_{DD}3$ to the PMOS clamping transistor 220. In another example, the third tracing diode 642 allows current flow only from the NMOS clamping transistor 222 to the input signal line 231 and the fourth tracing diode 644 allows current flow only from the NMOS clamping transistor 222 to $V_{SS}2$.

However, rather than controlling the gate and body terminal voltages of the PMOS clamping transistor 220 with the first and second PMOS tracing transistors 232, 234, the gate and body terminal voltages of the PMOS clamping circuit 220 are controlled by the first and second tracing diodes 632 and 634. Further, rather than controlling the gate and body terminal voltages of the NMOS clamping circuit 222 with the first and second NMOS tracing circuits 242, 244, the gate and body terminal voltages of the NMOS clamping circuit 222 are controlled by the third and fourth tracing diodes 642, 644. In addition, architecture 600 may be arranged like the previous embodiments as described in FIG. 5 except with a switch 528 coupled between $V_{DD}3$ and the anode of the tracing diode 634 instead of a switch 228 coupled between the Vss3 and cathode of tracing diode 644.

Figure 7:
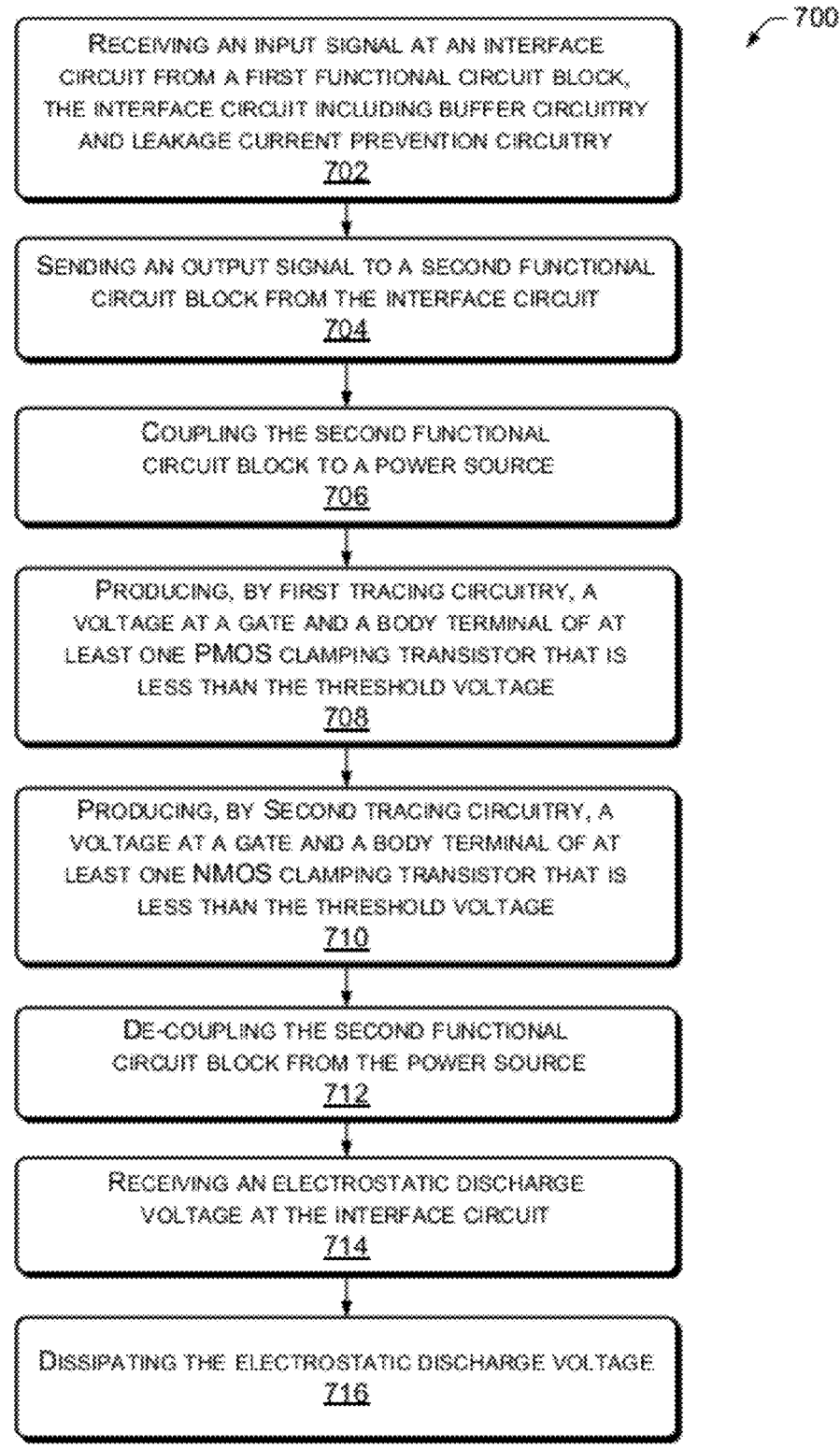
FIG. 7 is a flow diagram of a process to minimize leakage current from a functional circuit block of a semiconductor chip while providing electrostatic discharge protection to buffer circuitry of an interface circuit coupled to the functional circuit block.

FIG. 7 is a flow diagram of a process to minimize leakage current from a functional circuit block of a semiconductor chip while providing electrostatic discharge protection to buffer circuitry of an interface circuit coupled to the functional circuit block. The process 700 is illustrated as a collection of blocks in a logical flow graph, which represent a sequence of operations that can be implemented in hardware. The order in which the operations are described is not intended to be construed as a limitation, and any number of the described blocks can be combined in any order and/or in parallel to implement the process.

At 702, the process 700 includes receiving an input signal at an interface circuit from a first functional circuit block. The interface circuit includes buffer circuitry including at least one PMOS buffer transistor and at least one NMOS buffer transistor. In addition, the interface circuit includes leakage current prevention circuitry including first tracing circuitry coupled to at least one PMOS clamping transistor and second tracing circuitry coupled to at least one NMOS clamping transistor. In some instances, the interface circuit may include circuit arrangements, such as those discussed above with respect to 240 of FIG. 2, FIG. 5, and 614 of FIG. 6.

At 704, an output signal is sent to a second functional circuit block from the interface circuit. The output signal from the interface circuit may correspond to the input signal. For example, the output signal may include the same or similar information as the input signal, the output signal may have a same or similar intensity as the input signal, the output signal may have a same or similar speed as the input signal, the output signal may be the inverted to the input signal, or a combination thereof. In addition, the input signal and the output signal may be an analog signal or a digital signal.

At 706, the second functional circuit block is coupled to a power source.

At 708, the first tracing circuitry produces a voltage at a gate and a body terminal of the at least one PMOS clamping transistor that is less than a threshold voltage of the at least one PMOS clamping transistor. Additionally, at 708, the second tracing circuitry produces a voltage at a gate and a body terminal of the at least one NMOS clamping transistor that is less than a threshold voltage of the at least one NMOS clamping transistor. In some cases, the voltages at the gate and body terminals of the at least one PMOS clamping transistor and/or the at least one NMOS clamping transistor are in a sub-threshold region.

At 710, the second functional circuit block is de-coupled from the power source (during normal operation) and, at 712, the interface circuit receives an electrostatic discharge voltage. At 714, the energy of the electrostatic discharge event is dissipated by the impedance device and the at least one PMOS clamping transistor or the at least one NMOS clamping transistor. In particular, the energy of the electrostatic discharge event is dissipated to a level that will not damage components of the buffer circuitry of the interface circuit. In some cases, the electrostatic discharge voltage is a positive voltage with respect to the $V_{SS}2$ line and the impedance device and the at least one NMOS clamping transistor are configured to dissipate the electrostatic discharge voltage. In other cases, the electrostatic discharge voltage is a negative voltage with respect to the $V_{DD}2$ line and the impedance device and the at least one PMOS clamping transistor are configured to dissipate the electrostatic discharge voltage.

For the purposes of this disclosure and the claims that follow, the terms "coupled" and "connected" have been used to describe how various elements interface. Such described interfacing of various elements may be either direct or indirect. Additionally, although features have been described in the illustrative embodiments of FIGS. 1-7 as being connected to a source or drain of the respective MOS transistors, these source or drain connections may be interchanged in other embodiments. Further, although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims. The specific features and acts described in this disclosure and variations of these specific features and acts may be implemented separately or may be combined.

The invention claimed is:

1. An electrostatic discharge (ESD) protection circuit arrangement comprising:
at least one MOS buffer transistor configured to receive an input signal from a first functional circuit block at a gate of the at least one MOS buffer transistor and to provide a first portion of an output signal to a second functional circuit block;
a leakage current prevention circuit comprising:
at least one MOS clamping transistor coupled to the at least one MOS buffer transistor; and
at least one MOS tracing circuitry coupled to the at least one MOS clamping transistor, the at least one MOS tracing circuitry having at least one MOS tracing transistor configured to control a voltage at a gate of the at least one MOS clamping transistor;
wherein at least one of a source or a drain of the at least one MOS clamping transistor or the at least one MOS tracing transistor is coupled to a first supply voltage, and
wherein the at least one MOS tracing transistor of a first MOS tracing circuitry comprises a first MOS tracing transistor and a second MOS tracing transistor coupled to the first MOS tracing transistor, and wherein the first MOS tracing transistor and the second MOS tracing transistor being transistors of a first MOS type.

2. The ESD protection circuit arrangement of claim 1, wherein the at least one MOS clamping transistor comprises a first MOS clamping transistor being a transistor of the first MOS type.

3. The ESD protection circuit arrangement of claim 2, wherein the at least one MOS tracing transistor of a second MOS tracing circuit comprises a third MOS tracing transistor and a fourth MOS tracing transistor coupled to the third MOS tracing transistor, and wherein the third MOS tracing transistor and the fourth MOS tracing transistor being transistors of a second MOS type.

4. The ESD protection circuit arrangement of claim 3, wherein the at least one MOS clamping transistor comprises a second MOS clamping transistor being a transistor of a second MOS type, and wherein at least one of a source or a drain of the second MOS clamping transistor is coupled to a second supply voltage.

5. The ESD protection circuit arrangement of claim 4, further comprising a switch coupled to at least one of a source or a drain of the fourth MOS tracing transistor, and wherein the switch is operable to couple the at least one of a source or a drain of the fourth MOS clamping transistor to an external supply voltage.

6. The ESD protection circuit arrangement of claim 5, wherein the second supply voltage and the external supply voltage are negative supply voltages.

7. The ESD protection circuit arrangement of claim 4, wherein the first MOS type and the second MOS type are of a same MOS type and is at least one of a PMOS or NMOS.

8. The ESD protection circuit arrangement of claim 4, wherein the first MOSS type is a PMOS and the second MOS type is a NMOS.

9. The ESD protection circuit arrangement of claim 4, wherein the first MOS type transistor is a NMOS and the second MOS type is a PMOS.

10. The ESD protection circuit arrangement of claim 1, wherein a gate and at least one of a drain or a source of the at least one MOS tracing transistor is coupled to a central node that is coupled to the gate of the at least one MOS clamping transistor.

11. The ESD protection circuit arrangement of claim 10, wherein a body terminal of the at least one MOS tracing transistor and a body terminal of the at least one MOS clamping transistor are coupled to the central node.

12. The ESD protection circuit arrangement of claim 1, further comprising a switch coupled to at least one of a source or a drain of the first MOS tracing transistor, and wherein the switch is operable to couple the at least one of a source or drain of the first MOS clamping transistor to an external supply voltage.

13. The ESD protection circuit arrangement of claim 12, wherein the first supply voltage and the external supply voltage are positive supply voltages.

14. The ESD protection circuit arrangement of claim 1, wherein the at least one MOS clamping transistor and the at least one MOS tracing transistor are coupled to an impedance device.

15. A method for electrostatic discharge (ESD) protection comprising;
    providing an interface circuit between a first functional circuit block and a second functional circuit block for sending an output signal corresponding to an input signal from the first functional circuit block to the second functional circuit block;
    providing a buffer circuitry and a leakage current prevention circuitry in the interface circuit;
    providing at least one tracing circuitry and at least one MOS clamping transistor in the leakage current prevention circuitry;
    coupling the second functional circuit block to a power source;
    de-coupling the second functional circuit block from the power source;
    maintaining, by the at least one tracing circuitry, a voltage at a gate of at least one MOS clamping transistor below its threshold voltage, during the coupling or de-coupling;
    upon receiving an electrostatic discharge voltage at the interface circuit, dissipating the electrostatic discharge voltage by the at least one MOS clamping transistor.

16. The method of claim 15, wherein maintaining, by the at least one tracing circuitry, a voltage at a gate of at least one MOS clamping transistor below its threshold voltage, during the coupling or de-coupling comprising:
    maintaining a voltage at a gate of a MOS clamping transistor of a first type below its threshold voltage by a first tracing circuitry of the at least one tracing circuitry; and
    maintaining a voltage at a gate of a MOS clamping transistor of a second type below its threshold voltage by a second tracing circuitry of the at least one tracing circuitry.

17. The method of claim 16, wherein the voltage of the gate of the MOS clamping transistor of the first type, the voltage of the gate of the MOS clamping transistor of the second type, or a combination thereof, are in a sub-threshold region.

\* \* \* \* \*